(12) United States Patent
Wang

(10) Patent No.: US 12,598,870 B2
(45) Date of Patent: Apr. 7, 2026

(54) ARCHITECTURE OF DISPLAY PANEL

(71) Applicant: NOVATEK Microelectronics Corp.,
Hsin-Chu (TW)

(72) Inventor: Shu-Fang Wang, Hsinchu City (TW)

(73) Assignee: NOVATEK Microelectronics Corp.,
Hsin-Chu (TW)

( * ) Notice: Subject to any disclaimer, the term of this
patent is extended or adjusted under 35
U.S.C. 154(b) by 378 days.

(21) Appl. No.: 18/195,916

(22) Filed: May 10, 2023

(65) Prior Publication Data

US 2024/0381703 A1      Nov. 14, 2024

(51) Int. Cl.
H10K 59/121          (2023.01)
H10K 59/123          (2023.01)

(52) U.S. Cl.
CPC ....... H10K 59/123 (2023.02); H10K 59/1216
(2023.02)

(58) Field of Classification Search
CPC ............. H10K 59/123; H10K 59/1216; H10K
59/8052; H10K 59/10; H10K 59/8051;
H10K 59/13–1315; H01L 23/522–53295;
H01L 21/768–76898; H10D 1/60–716
See application file for complete search history.

(56) References Cited

U.S. PATENT DOCUMENTS

2006/0082284 A1*   4/2006   Shibusawa ............. H10D 86/00
                                                              313/500
2013/0201085 A1*   8/2013   Chang .................. H10K 59/126
                                                              345/76

2020/0119126 A1*   4/2020   Jo ........................ H10K 59/126
2023/0015395 A1    1/2023   Lee
2023/0246150 A1*   8/2023   Park ..................... H10D 86/481
                                                              257/79
2023/0422554 A1*   12/2023  Kim ..................... G09G 3/3233
2024/0057398 A1*   2/2024   Park ................... H10K 59/1315
2024/0373674 A1*   11/2024  Liu ........................ H10K 50/00

FOREIGN PATENT DOCUMENTS

CN         212342631 U      1/2021
CN         115633521 A  *   1/2023   ............. G09F 9/335
CN         113748528 B      4/2023
TW         201322341 A1     6/2013

* cited by examiner

*Primary Examiner* — Shahed Ahmed
*Assistant Examiner* — Adam D Weiland
(74) *Attorney, Agent, or Firm* — Winston Hsu

(57)          ABSTRACT

A display panel includes a plurality of pixels, among which
a first pixel includes a light emitting device, a first metalli-
zation layer and a second metallization layer below the first
metallization layer. The light emitting device has a first
electrode and a second electrode. The first metallization
layer includes an inner electrode plate coupled to the first
electrode of the light emitting device, and includes an outer
electrode plate coupled to the second electrode of the light
emitting device and separated from the inner electrode plate
by a first loop space. The second metallization layer includes
an inner electrode plate coupled to the inner electrode plate
of the first metallization layer, and includes an outer elec-
trode plate separated from the inner electrode plate by a
second loop space. Wherein, a length of the second loop
space is different from a length of the first loop space.

10 Claims, 13 Drawing Sheets

ARCHITECTURE OF DISPLAY PANEL

BACKGROUND OF THE INVENTION

1. Field of the Invention

The present invention relates to an architecture of a display panel, and more particularly, to an architecture of an organic light emitting diode (OLED) panel.

2. Description of the Prior Art

Unlike conventional light emitting diode (LED) or organic LED (OLED) panels with their screens being built on a glass substrate, the screen of the next-generation OLED panel (e.g., a micro-OLED panel) is directly mounted to a silicon wafer. In the fabricating process of this next-generation OLED panel, the pixel elements such as capacitors and metal-oxide semiconductor (MOS) transistors and the related metal wires are implemented with the complementary metal-oxide semiconductor (CMOS) process, and then the OLED elements are evaporation plated on the top metallization layer. A top-emission OLED panel can thereby be manufactured.

In the top-emission OLED panel, the light emitted by the OLEDs is delivered upwards to generate desired images, but there may be partial light leaking to the MOS transistors in the bottom layer. The leakage light irradiating the MOS transistors may cause a leakage current of the transistors. In general, the operational current for driving the OLEDs is usually in the levels between nanoamperes and picoamperes. In such a situation, the leakage current is requested to be lower than several fentoamperes to avoid affecting the normal light emission of the OLEDs.

SUMMARY OF THE INVENTION

It is therefore an objective of the present invention to provide a novel architecture of an organic light emitting diode (OLED) panel, in order to reduce the leakage light irradiating the transistors and minimize the leakage current.

An embodiment of the present invention discloses a display panel, which comprises a plurality of pixels, wherein a first pixel among the plurality of pixels comprises a light emitting device, a first metallization layer and a second metallization layer below the first metallization layer. The light emitting device has a first electrode and a second electrode. The first metallization layer comprises an inner electrode plate and an outer electrode plate, wherein the inner electrode plate is coupled to the first electrode of the light emitting device, and the outer electrode plate is coupled to the second electrode of the light emitting device and separated from the inner electrode plate of the first metallization layer by a first loop space. The second metallization layer comprises an inner electrode plate and an outer electrode plate, wherein the inner electrode plate is coupled to the inner electrode plate of the first metallization layer, and the outer electrode plate is separated from the inner electrode plate of the second metallization layer by a second loop space. Wherein, a length of the second loop space is different from a length of the first loop space.

These and other objectives of the present invention will no doubt become obvious to those of ordinary skill in the art after reading the following detailed description of the preferred embodiment that is illustrated in the various figures and drawings.

DETAILED DESCRIPTION

As for a silicon-based organic light emitting diode (OLED) panel, the capacitors and metal-oxide semiconductor (MOS) transistors in the pixels and their wire connections are implemented with the complementary metal-oxide semiconductor (CMOS) process, and then the anode, emitting layer, and cathode of the OLEDs are evaporation plated on these circuit elements and metal wires (i.e., on the top metallization layer). The emitting layer may be plated with red, green or blue materials to emit different colors, or plated with a white material which is deployed with a color filter to generate different colors.

Figure 1:
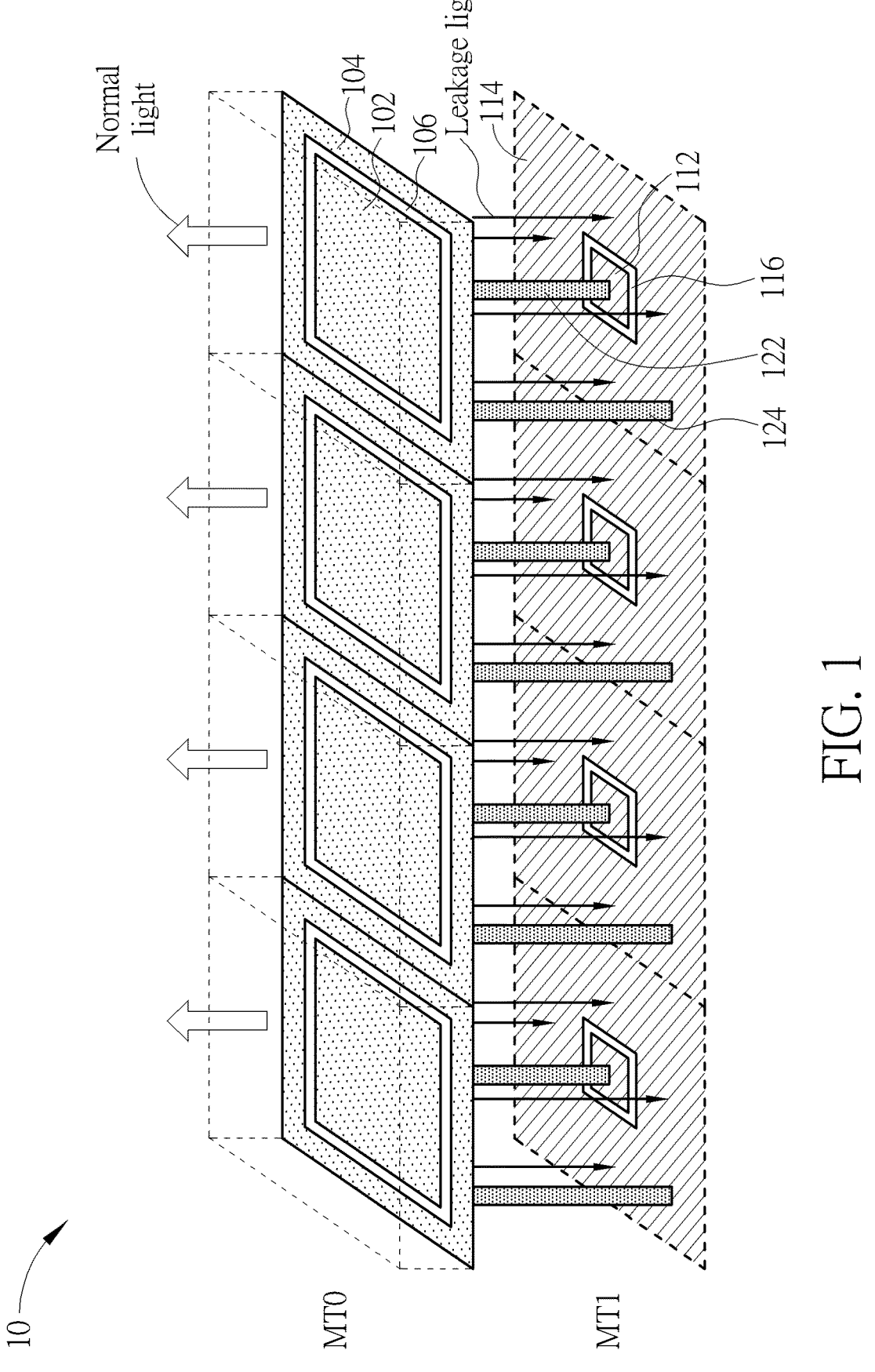
FIG. 1 is a schematic diagram of a display panel according to an embodiment of the present invention.

In order to suppress the leakage light toward the MOS transistors in the bottom layer, the present invention provides a novel design of the metallization layers in the CMOS process to block the leakage light. FIG. 1 is a schematic diagram of a display panel 10 according to an embodiment of the present invention. The display panel 10 may include a plurality of pixels, where the structure of several metallization layers in 4 pixels is illustrated. As shown in FIG. 1, each pixel comprises a top metallization layer MT0 (which is the topmost layer) and a second metallization layer MT1 (which is next to and below the top metallization layer MT0). Other lower metallization layers and other components of the pixels such as transistors, capacitors, and light emitting devices are omitted in FIG. 1 for brevity.

In each pixel, the top metallization layer MT0 may include an inner electrode plate 102 and an outer electrode plate 104, which are separated from each other by a loop space 106. The loop space 106 may be filled with insulating materials such as oxide. The inner electrode plate 102 is in the area surrounded by the loop space 106, and the outer electrode plate 104 is outside the loop space 106. The inner electrode plate 102 may be coupled to an electrode of the light emitting device in the pixel, such as the anode of the OLED. The outer electrode plate 104 may be coupled to another electrode of the light emitting device, such as the cathode of the OLED. Since the anode of the OLED is mounted on the inner electrode plate 102, the size of the inner electrode plate 102 is preferably as large as possible, in order to generate a stronger light intensity.

The second metallization layer MT1 may include an inner electrode plate 112 and an outer electrode plate 114, which are separated from each other by a loop space 116. Similarly, the loop space 116 may be filled with insulating materials such as oxide. The inner electrode plate 112 is in the area surrounded by the loop space 116, and the outer electrode plate 114 is outside the loop space 116. The inner electrode plate 112 may be coupled to the inner electrode plate 102 through at least one via 122. The outer electrode plate 114 may be coupled to the outer electrode plate 104 through at least one via 124. The inner electrode plate 112 and the outer electrode plate 114 may further be coupled to bottom layers through other vias, to forward the supply voltages and/or currents to be provided for the anode and the cathode of the OLED. Note that FIG. 1 illustrates only one via for each electrode plate, but a skilled person would understand that there may be multiple vias deployed between metallization layers to improve the capability of voltage/current transmissions.

As shown in FIG. 1, the OLED in each pixel may generate normal light emission, which may emit upward to generate desired brightness. In addition, partial light may be emitted downward through reflection, refraction or scattering, to generate leakage light toward the circuit elements in the bottom layers. In the metallization layers MT0 and MT1, the leakage light may pass through the transparent loop spaces 106 and 116. Therefore, in order to block the leakage light and reduce the light reaching the bottom layers, the length of the loop space 116 should be different from the length of the loop space 106, and/or the area surrounded by the loop space 116 should be different from the area surrounded by the loop space 106. More specifically, the loop space 106 and the loop space 116 should not overlap, in order to avoid a direct light path toward the bottom layers.

As mentioned above, the anode of the OLED is mounted on the inner electrode plate 102, and the inner electrode plate 102 should have a larger area to generate stronger light intensity. In such a situation, the loop space 106 in the top metallization layer MT0 may have a larger diameter or length. In this embodiment, the loop space 106 is a square loop space to be adapted to the area of the pixel. Therefore, the square loop space 106 may have a longer side length.

In order to block the downward leakage light, the diameter or length of the loop space 116 in the second metallization layer MT1 may be far shorter than the diameter or length of the loop space 106 in the top metallization layer MT0. Similarly, the loop space 116 may be a square loop space. Therefore, the square loop space 116 may have a side length shorter than the side length of the loop space 106.

Figure 2:
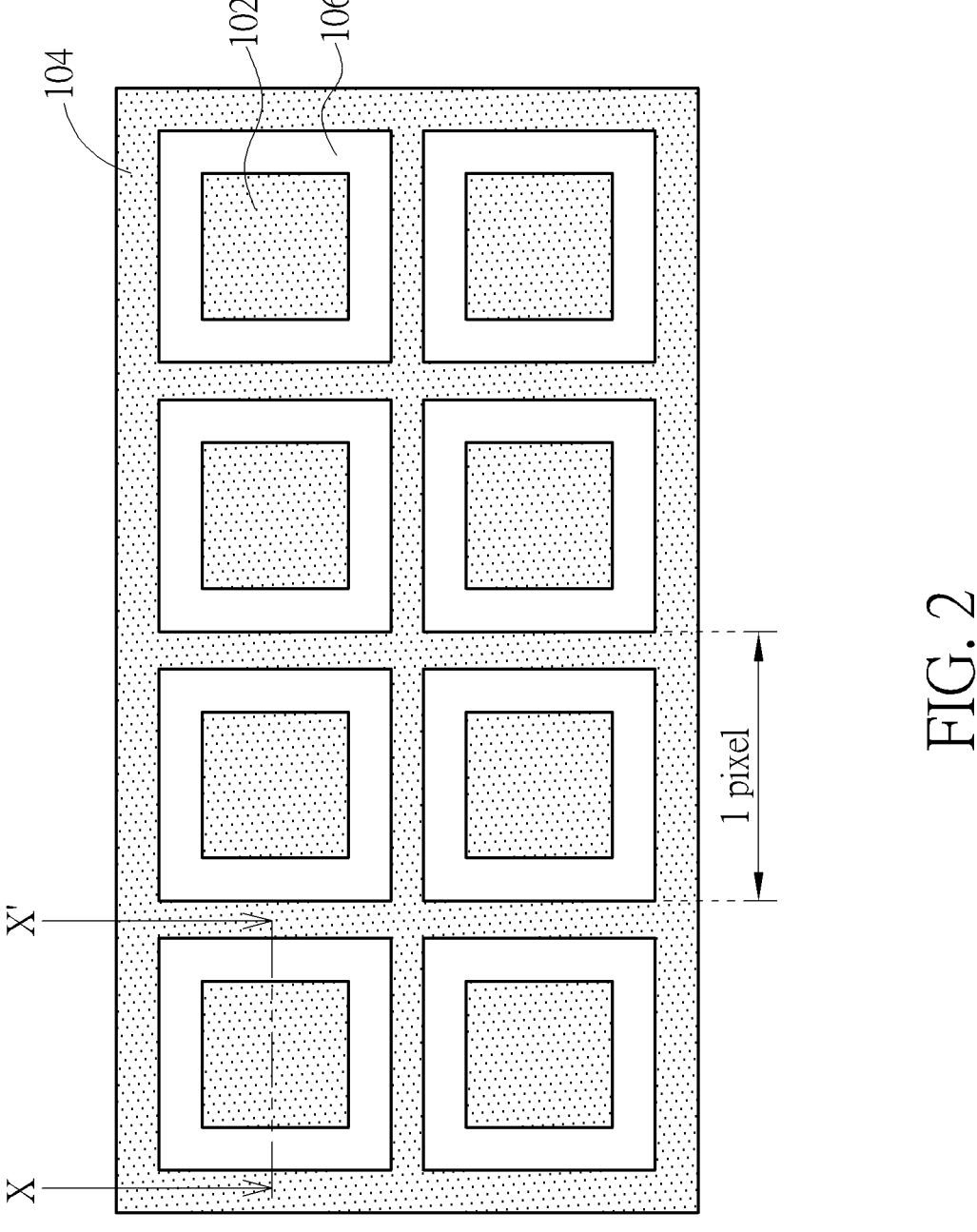
FIG. 2 illustrates a top view of the top metallization layer.

FIG. 2 illustrates a top view of the top metallization layer MT0. As shown in FIG. 2, each loop space 106 corresponds to a pixel. The inner electrode plate 102 surrounded by the loop space 106 may be coupled to the anode of the corresponding OLED. The outer electrode plates 104 of different pixels are connected, to receive the same voltage level and to be coupled to the cathode of the corresponding OLEDS.

Figure 3:
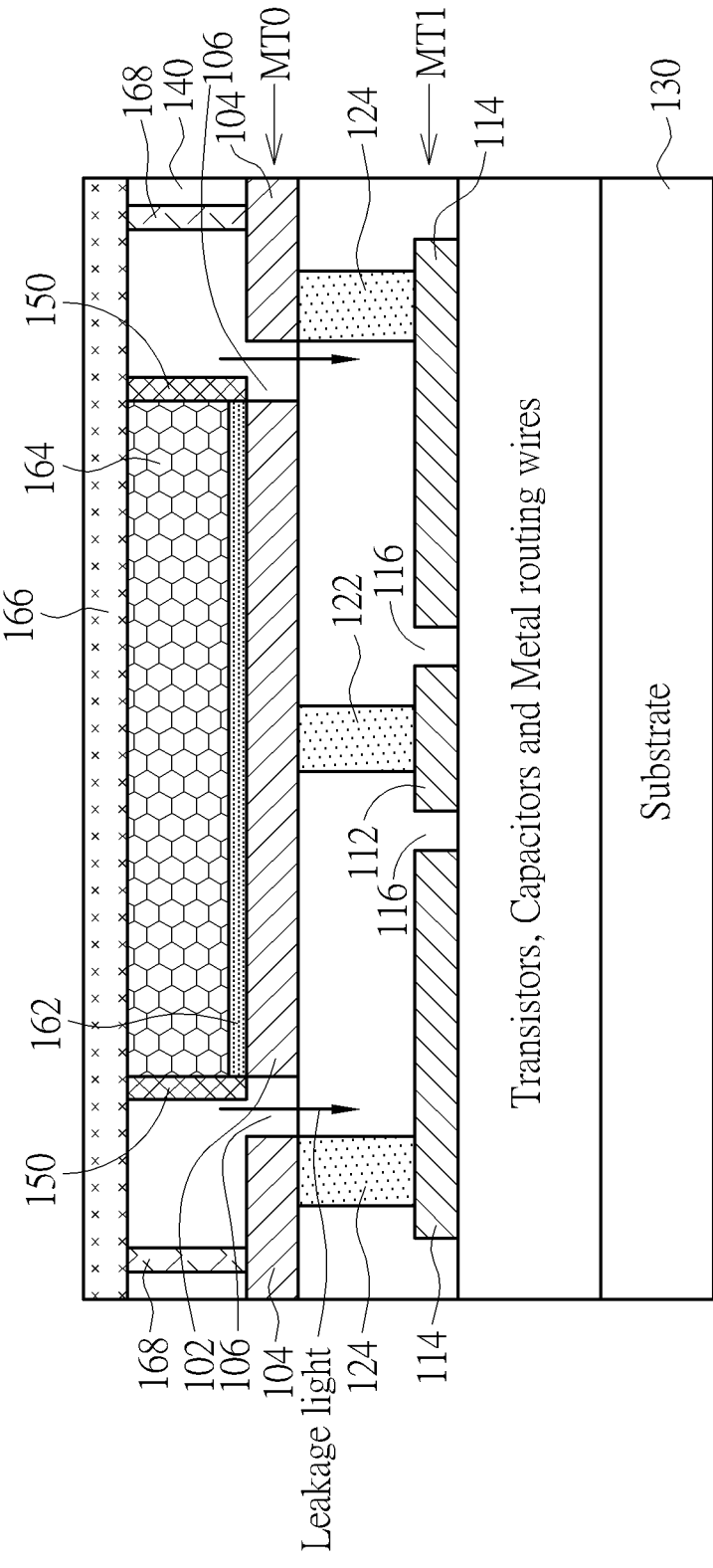
FIG. 3 illustrates a cross-sectional view of a pixel in the display panel.

FIG. 3 illustrates a cross-sectional view of a pixel in the display panel 10, to show the cross section of X-X' in FIG. 2. The pixel includes the inner electrode plate 102 and the outer electrode plate 104 of the top metallization layer MT0, the inner electrode plate 112 and the outer electrode plate 114 of the second metallization layer MT1, and the vias 122 and 124 connected between the metallization layers MT0 and MT1. The pixel also includes a substrate 130, on which the transistors and capacitors of the pixel and the related metal routing wires in other lower metallization layers are deployed. Above the top metallization layer MT0, the pixel further includes a passivation layer 140, an isolation layer 150, and an OLED, which includes an anode layer 162, an emitting layer 164, a cathode layer 166 and a cathode via 168.

As shown in FIG. 3, the anode layer 162 of the OLED is mounted on and covers the inner electrode plate 102 of the top metallization layer MT0, and the area of the emission surface of the anode layer 162 is substantially equal to the surface area of the inner electrode plate 102. The light emission of the OLED is generated on the area of the anode layer 162. Therefore, the surface area of the inner electrode plate 102 is preferably larger to enhance the light intensity.

In addition, FIG. 3 shows that the leakage light from the OLED may be delivered downwards through the gap in the top metallization layer MT0 (i.e., the loop space 106). The leakage light may be blocked by the metal in the second metallization layer MT1 since the gap in the top metallization layer MT0 does not overlap the gap in the second metallization layer MT1.

Figure 4A:
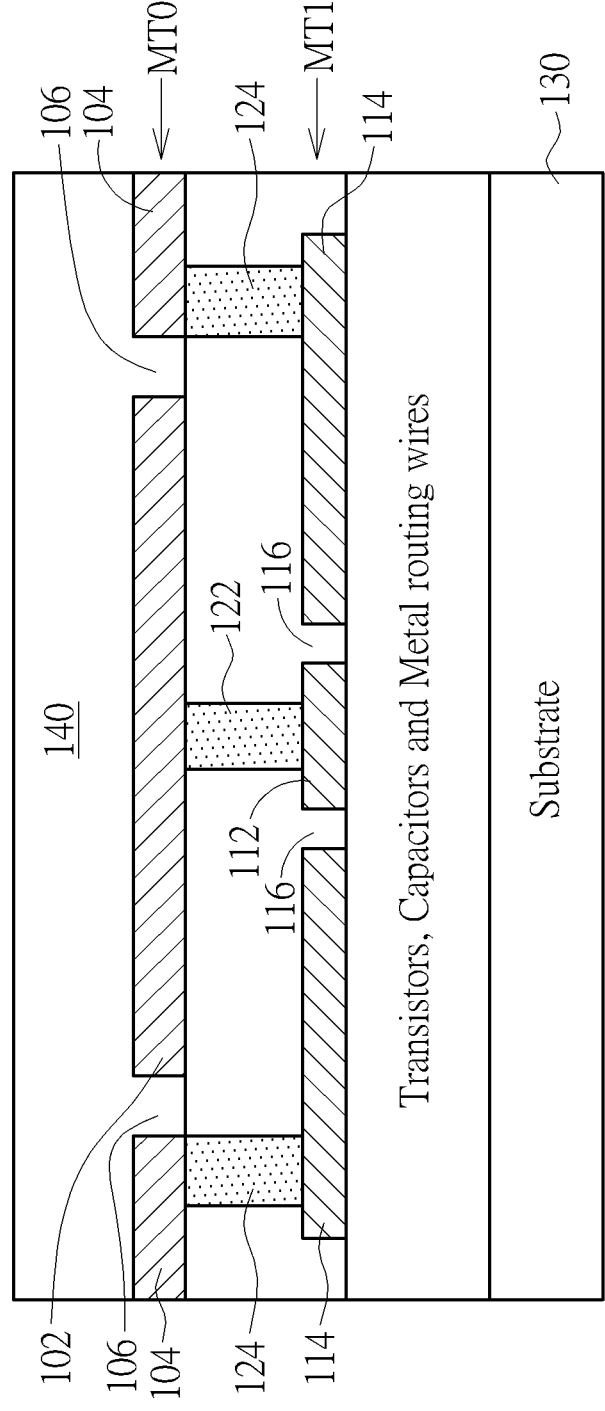
FIGS. 4A-4E illustrate the process of fabricating the pixel architecture shown in FIG. 3 according to an embodiment of the present invention.

FIGS. 4A-4E illustrate the process of fabricating the pixel architecture shown in FIG. 3 according to an embodiment of the present invention. In an embodiment, the pixel elements are implemented with the CMOS process to be fabricated on a silicon wafer. Therefore, the substrate 130, which is used for carrying the circuit elements in the pixels, may be a silicon substrate. In the CMOS fabrication process as shown in FIG. 4A, the transistors and capacitors of the pixel are implemented on the silicon substrate 130, and then the metal routing wires of the metallization layers (including the second metallization layer MT1 and the top metallization layer MT0) are formed layer by layer from bottom to top. The metal electrodes in the metallization layers and the vias therebetween may be formed by aluminum, copper, tungsten, or any other electrically conductive materials. The detailed structures of the transistors are well known by those skilled in the art, and thus omitted herein without influencing the illustrations of the present embodiment.

In addition, a passivation layer 140 may be deposited on the top metallization layer MT0. The passivation layer 140 may include a passivation film, which may be formed by the silicon dioxide, silicon nitride or silicon oxide, but not limited thereto.

Figure 4B:
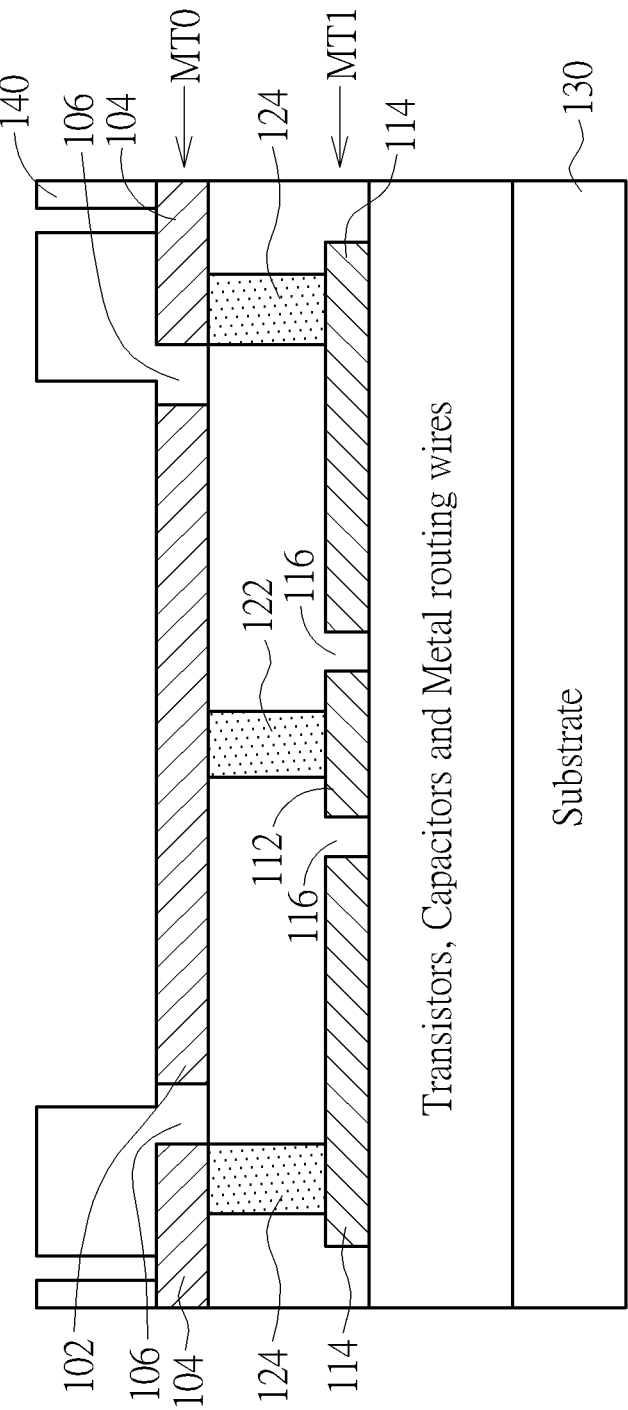

Subsequently, the passivation layer 140 may be etched so that the OLED materials may be inserted into the passivation layer 140 (e.g., through evaporation planting), as shown in FIG. 4B. In an embodiment, a plasma etching may be performed to remove predefined portions of the passivation layer 140, to generate several holes to be filled with organic materials and electrode materials of the OLED.

Figure 4C:
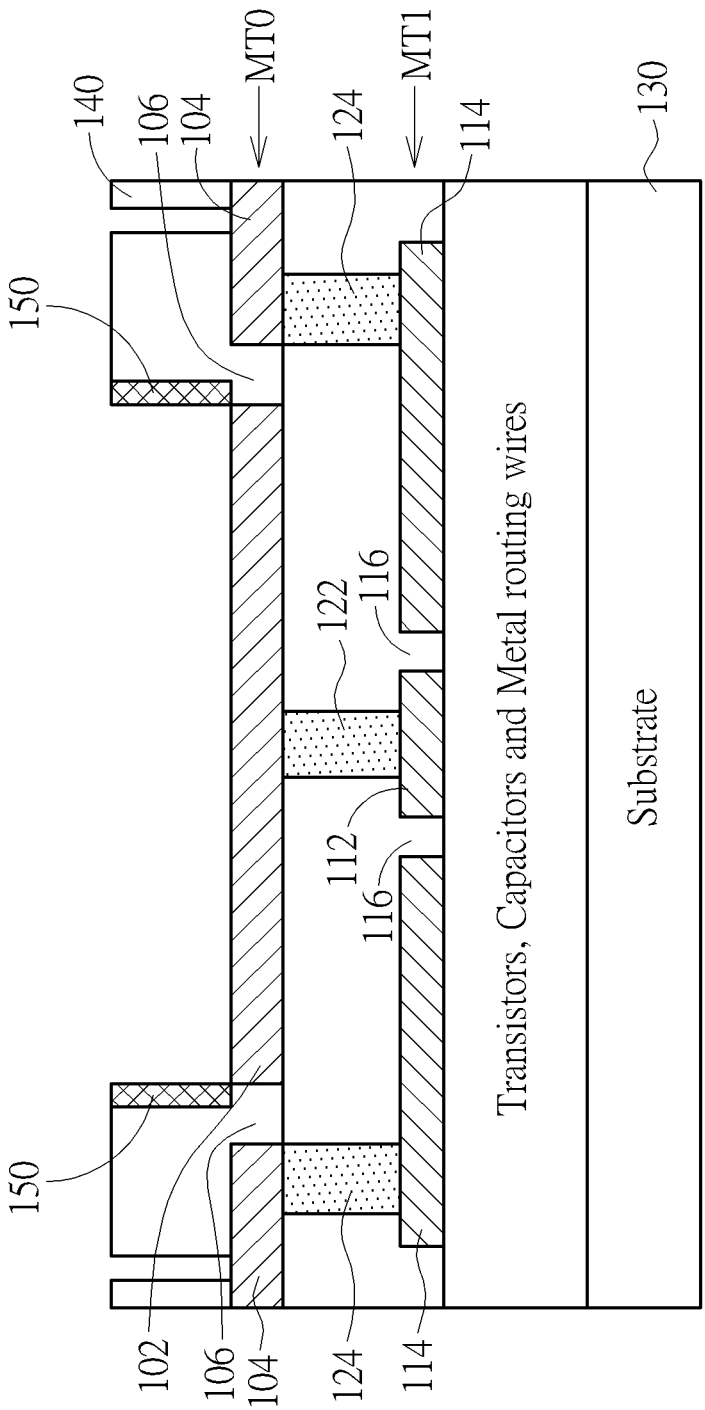

Referring to FIG. 4C, after the etching process, the isolation layer 150 may be deposited on the side wall of the inner hole of the passivation layer 140. The materials to form the isolation layer 150 may be, but not limited to, the silicon dioxide, silicon nitride, silicon oxide, or any other non-conductive materials.

Figure 4D:
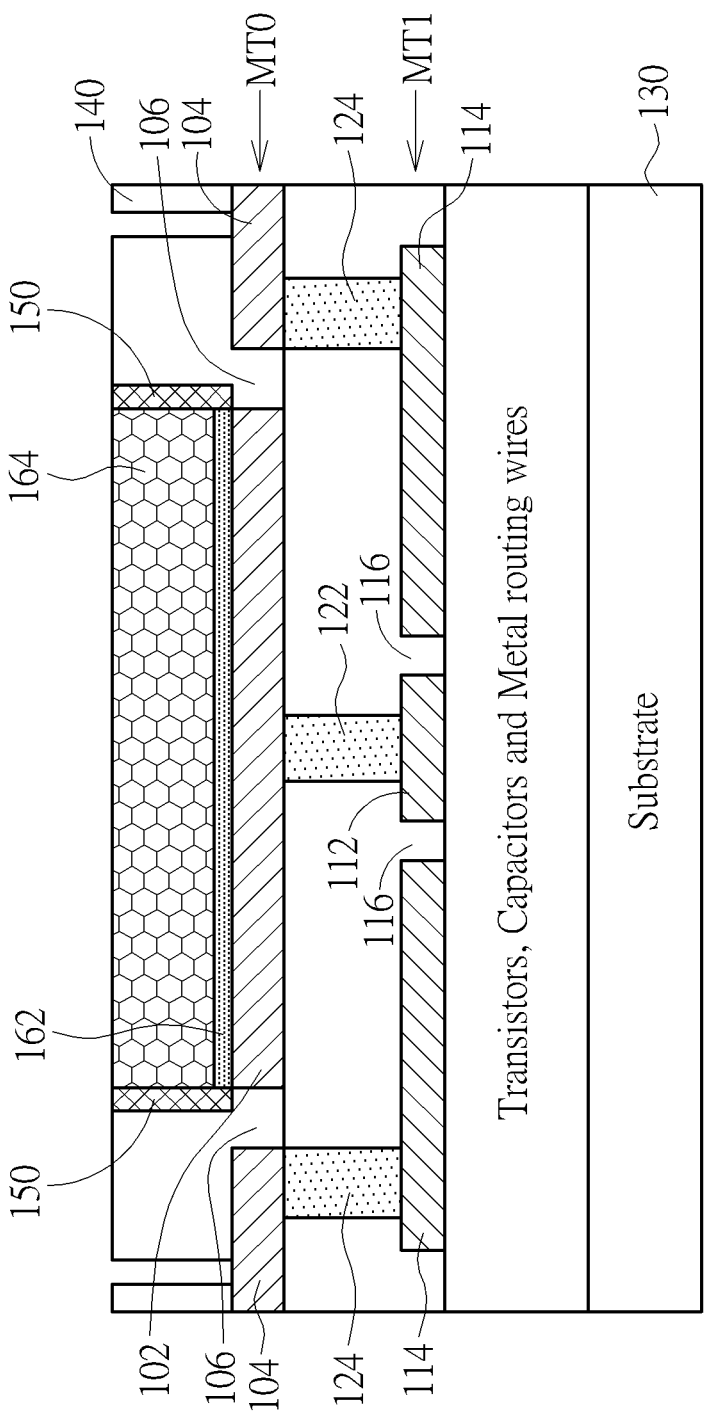
Figure 4E:
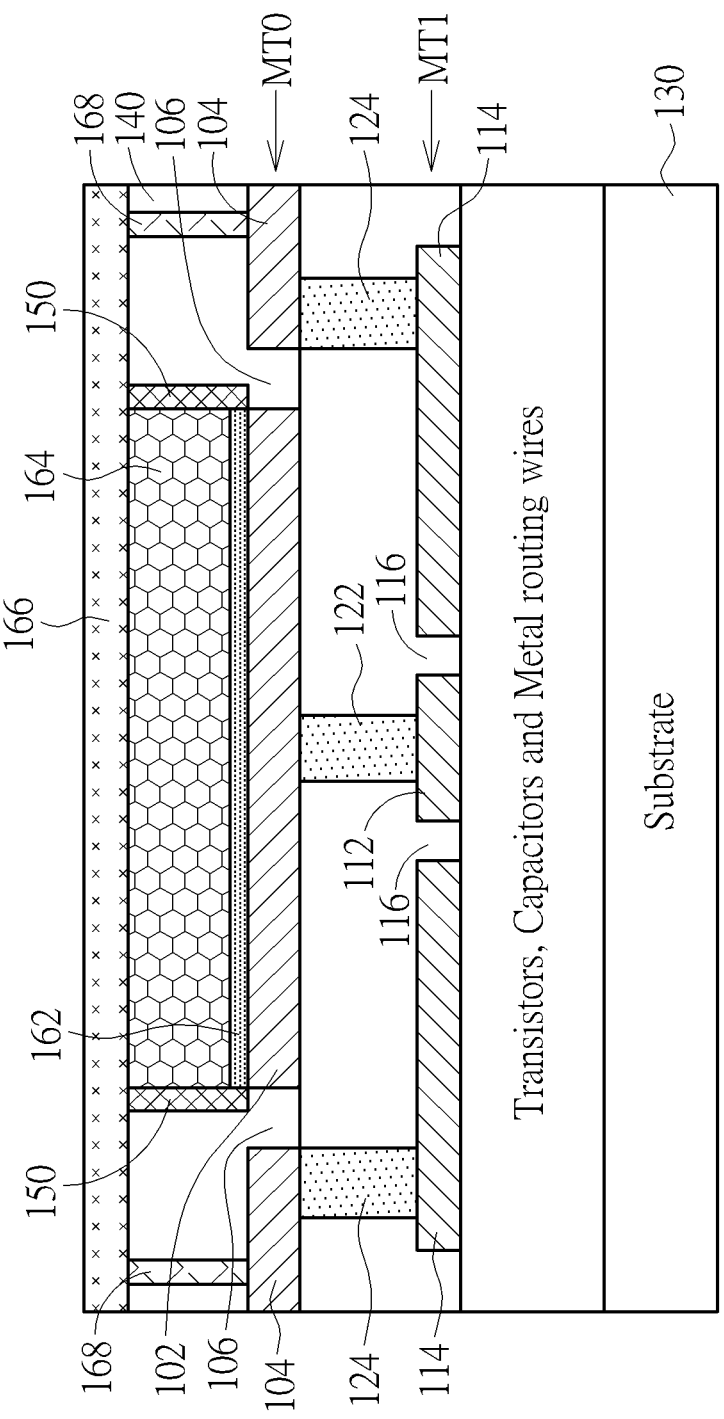

Subsequently, the anode layer 162 and the emitting layer 164 of the OLED are inserted into the inner hole of the passivation layer 140, as shown in FIG. 4D. The cathode via 168 is then inserted into the outer hole of the passivation layer 140, and the cathode layer 166 of the OLED is plated on the surface of the emitting layer 164 and the passivation layer 140, as shown in FIG. 4E. In an embodiment, the evaporation planting process may be applied to insert the OLED materials, which include the anode layer 162, the emitting layer 164 and the cathode layer 166.

In an embodiment, the emitting layer 164 may include organic materials capable of emitting light. The anode layer 162 and the cathode layer 166 may be formed by a transparent conductive material such as the indium tin oxide (ITO) or indium zinc oxide (IZO), to avoid blocking the normal light emission upwards. The cathode via 168 may be formed by any electrically conductive material such as the ITO, IZO, or tungsten.

Please note that the present invention aims at providing a novel architecture of pixels of a display panel. Those skilled in the art may make modifications and alterations accordingly. For example, in the above embodiments, the length of the loop space in the top metallization layer is greater than the length of the loop space in the second metallization layer below the top metallization layer, so as to generate a larger light emission surface on the inner electrode plate. In another embodiment, in order to avoid the leakage light emitting downward to the bottom layers, the length of the loop space in the top metallization layer may be smaller than the length of the loop space in the second metallization layer. As long as the gaps in two adjacent metallization layers do not overlap so as to block the downward leakage light, the related implementations should belong to the scope of the present invention. In addition, the square loop space in the above embodiments is merely an example for illustrating the gap in the metallization layer. In another embodiment, the loop space may be in any shape, such as circular loop, rectangular loop or irregular loop, but not limited thereto.

Figure 5:
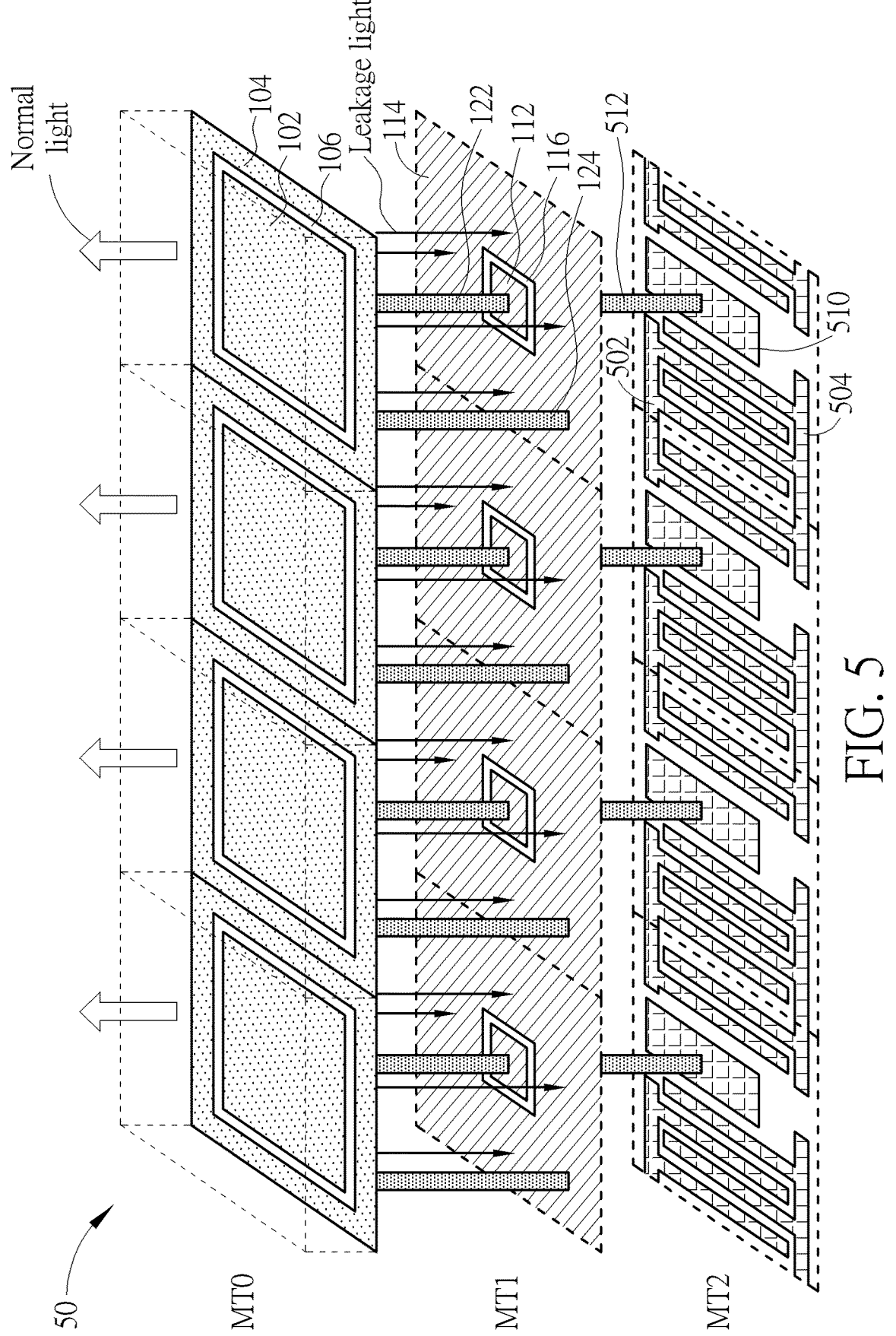
FIG. 5 is a schematic diagram of a display panel according to an embodiment of the present invention.

In several embodiments, the second metallization layer MT1 and other lower metallization layers may be well designed to further block and reduce the downward leakage light. FIG. 5 is a schematic diagram of a display panel 50 according to an embodiment of the present invention. The structure of the display panel 50 is similar to the structure of the display panel 10, so components and elements having similar functions are denoted by the same symbols. The difference between the display panel 50 and the display panel 10 is that, in the display panel 50, the structure of the third metallization layer MT2 is designed to deploy a metal-oxide-metal (MOM) capacitor.

More specifically, the third metallization layer MT2 is below and adjacent to the second metallization layer MT1. As shown in FIG. 5, in each pixel, the metallization layer MT2 may include two metal wires 502 and 504 having a finger pattern interlacing to form the MOM capacitor. The third metallization layer MT2 may further include a specific electrode plate 510, which is coupled to the inner electrode plate 112 of the second metallization layer MT1 through at least one via 512, to forward the voltage and/or current to be provided for the anode of the OLED. Preferably, the diameter, side length, and/or area of the specific electrode plate 510 may be different from those of the inner electrode plate 112, in order to prevent any leakage light from passing through the gap surrounding the specific electrode plate 510. Similarly, the specific electrode plate 510 may be in any shape, which is not limited to that shown in FIG. 5.

Note that the pixel circuit of a display panel usually has a storage capacitor for storing the data voltage and the threshold voltage information. The MOM capacitor consisting of the metal wires 502 and 504 may realize the storage capacitor. The spacing between the finger patterns of the metal wires 502 and 504 may be well allocated to achieve a higher density, so as to reduce the space that forwards the downward leakage light. In addition, the gap between fingers of the MOM capacitor may usually be smaller than the gap of general metal routing wires for forwarding signals, so that the deployment of the metal wires 502 and 504 of the MOM capacitor may achieve a higher metal density and smaller gap, with appropriate metal finger design to achieve a better effect of light blocking.

Figure 6:
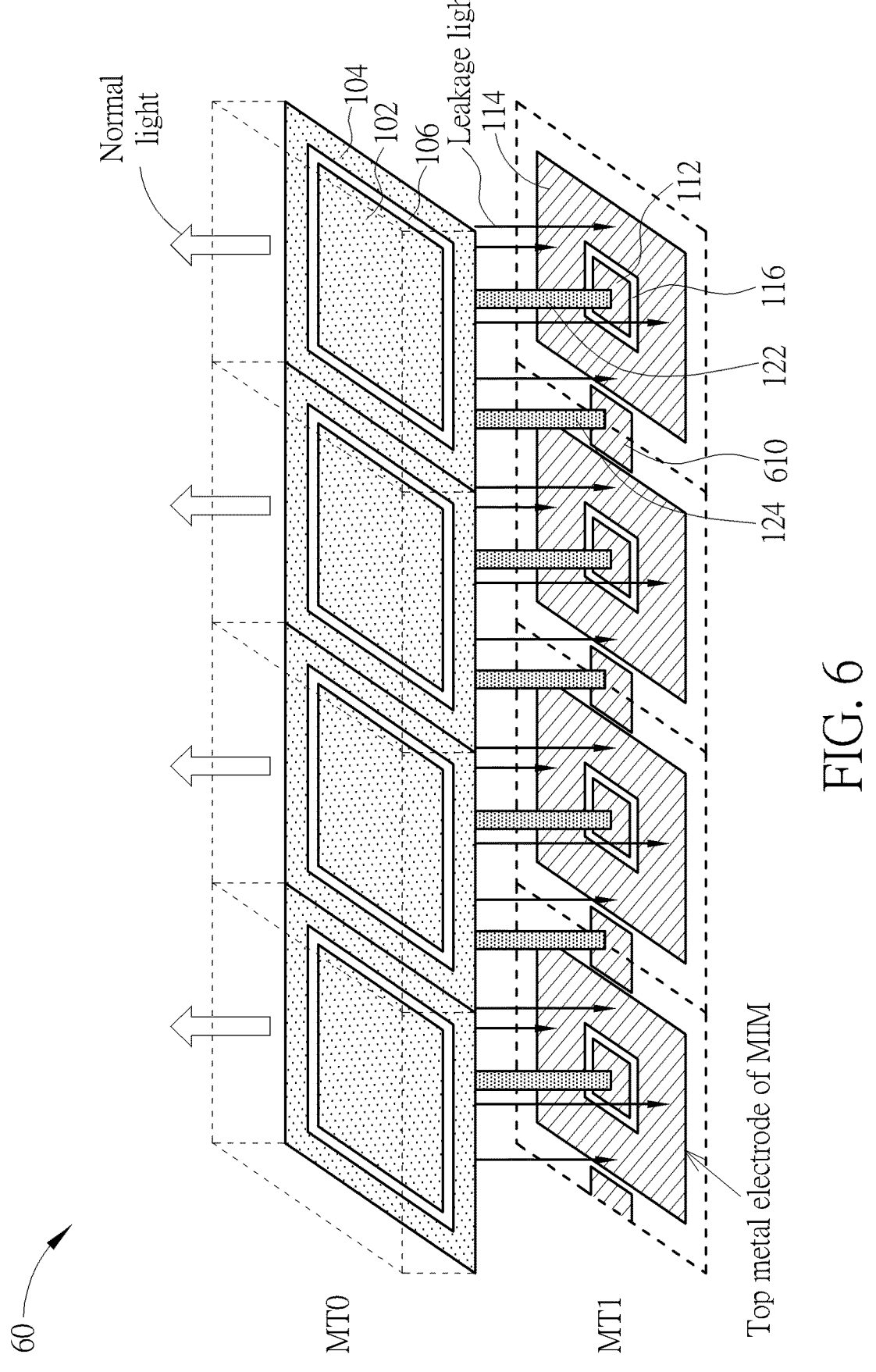
FIG. 6 is a schematic diagram of another display panel according to an embodiment of the present invention.

FIG. 6 is a schematic diagram of another display panel 60 according to an embodiment of the present invention. The structure of the display panel 60 is similar to the structure of the display panel 10, so components and elements having similar functions are denoted by the same symbols. The difference between the display panel 60 and the display panel 10 is that, in the display panel 60, the outer electrode plate 114 of the second metallization layer MT1 may form the top metal electrode of a metal-insulator-metal (MIM) capacitor, and the outer electrode plate 104 of the top metallization layer MT0 is coupled to another electrode plate 610 deployed at the border of the pixel through the vias 124. Therefore, the voltage/current for the cathode of the OLED may be provided through the electrode plate 610.

In this embodiment, the MIM capacitor may be implemented in the metallization layer MT1 and other lower metallization layers, to realize the storage capacitor of the pixel. As the top metal electrode of the MIM capacitor, the outer electrode plate 114 may be a large-area metal electrode plate capable of blocking a great amount of leakage light. The large-area metal electrode plate of the MIM capacitor may be superior to the finger pattern of the MOM MIM capacitor in consideration of the effect of light blocking.

In each pixel, since most area of the second metallization layer MT1 serves to realize the MIM capacitor, the area of the electrode plate 610 may not be enough to provide sufficient voltage/current transmission capability for the cathode of the OLED, such that the voltage drop may be severe if there is a great amount of current flowing through the cathode. In order to solve this problem, the outer electrode plate 104 of the top metallization layer MT0 may further be coupled to a voltage supply circuit through a routing metal outside the pixels, to receive the voltage/current for the cathode of the OLED from the voltage supply circuit.

Figure 7:
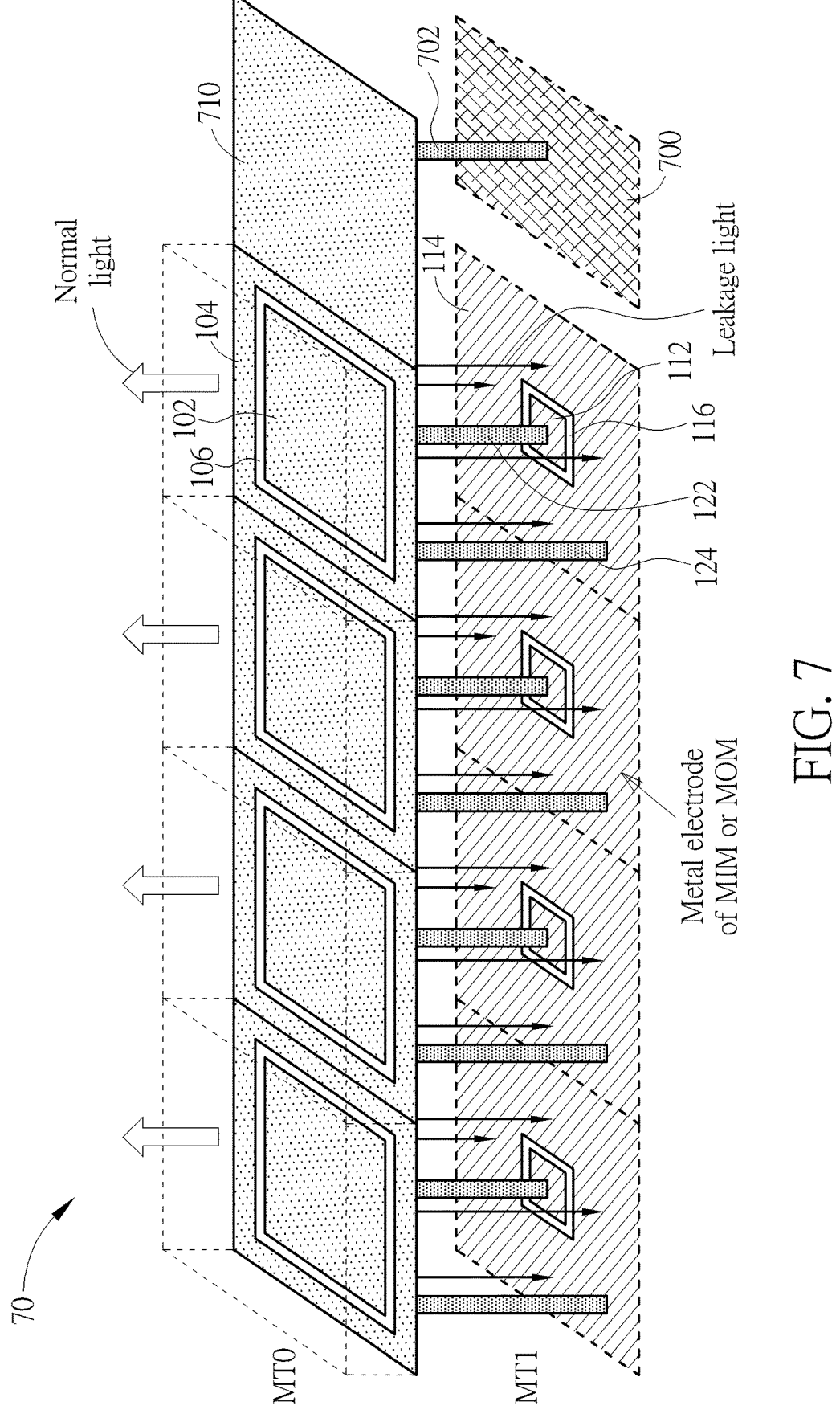
FIG. 7 is a schematic diagram of a further display panel according to an embodiment of the present invention.

FIG. 7 is a schematic diagram of a further display panel 70 according to an embodiment of the present invention. In the display panel 70, the outer electrode plate 114 of the second metallization layer MT1 may serve as a metal electrode of the MIM capacitor or MOM capacitor. Therefore, in order to provide sufficient voltage/current for the cathode of the OLED, the outer electrode plate 104 may be coupled to an external metal plate 710 in the top metallization layer MT0 outside the pixels, to be further coupled to a voltage supply circuit 700 through at least one via 702, to receive a required voltage (e.g., negative voltage) from the voltage supply circuit 700.

Figure 8:
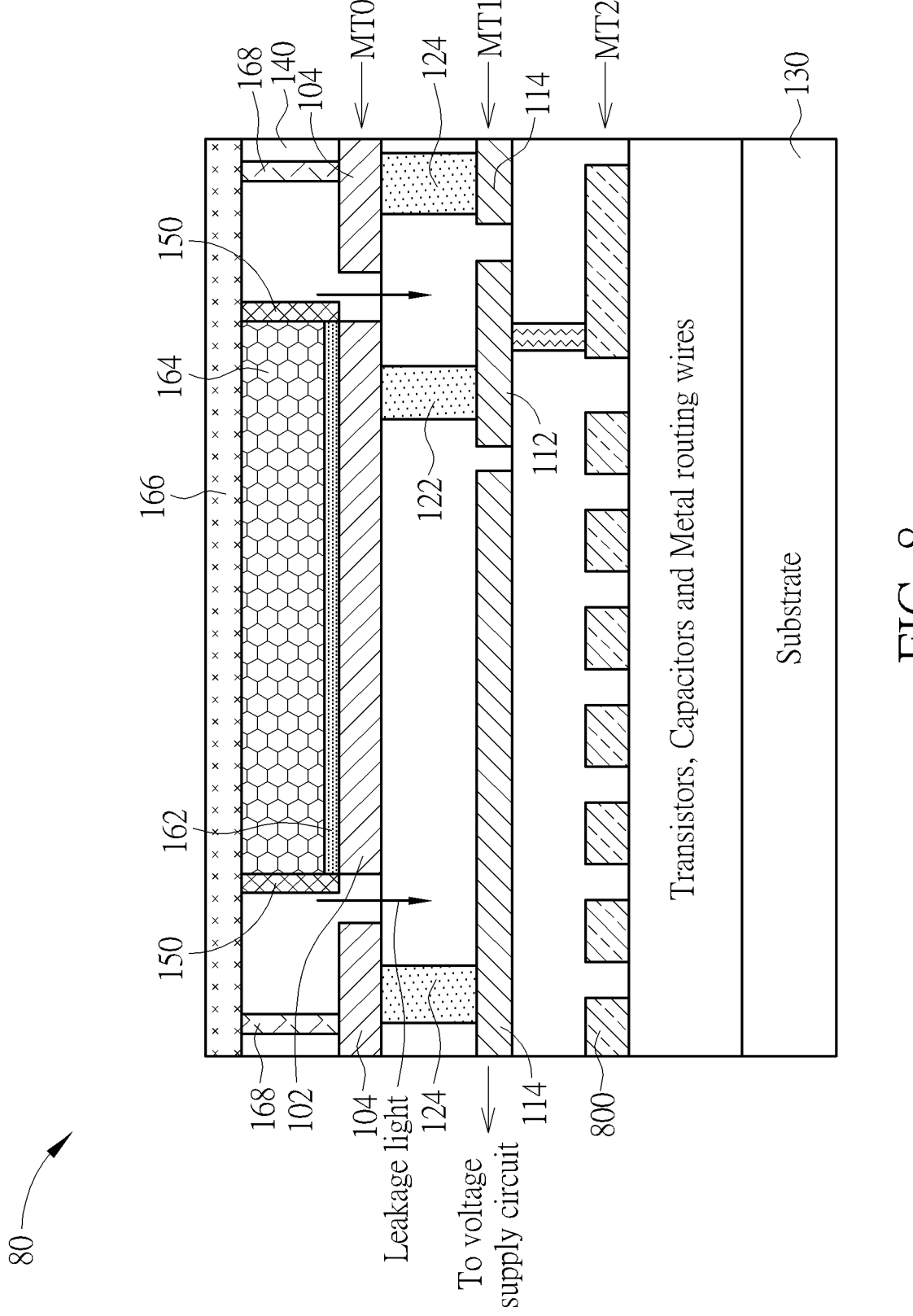
FIG. 8 illustrates a cross-sectional view of a pixel in which a MOM capacitor is deployed to block the leakage light.

FIG. 8 illustrates a cross-sectional view of a pixel 80 in which a MOM capacitor is deployed to block the leakage light. The pixel structure shown in FIG. 8 is similar to that shown in FIG. 3, and thus similar components are denoted by the same symbols. In the pixel 80, a MOM capacitor 800 including multiple fingers is deployed in the third metallization layer MT2.

Figure 9:
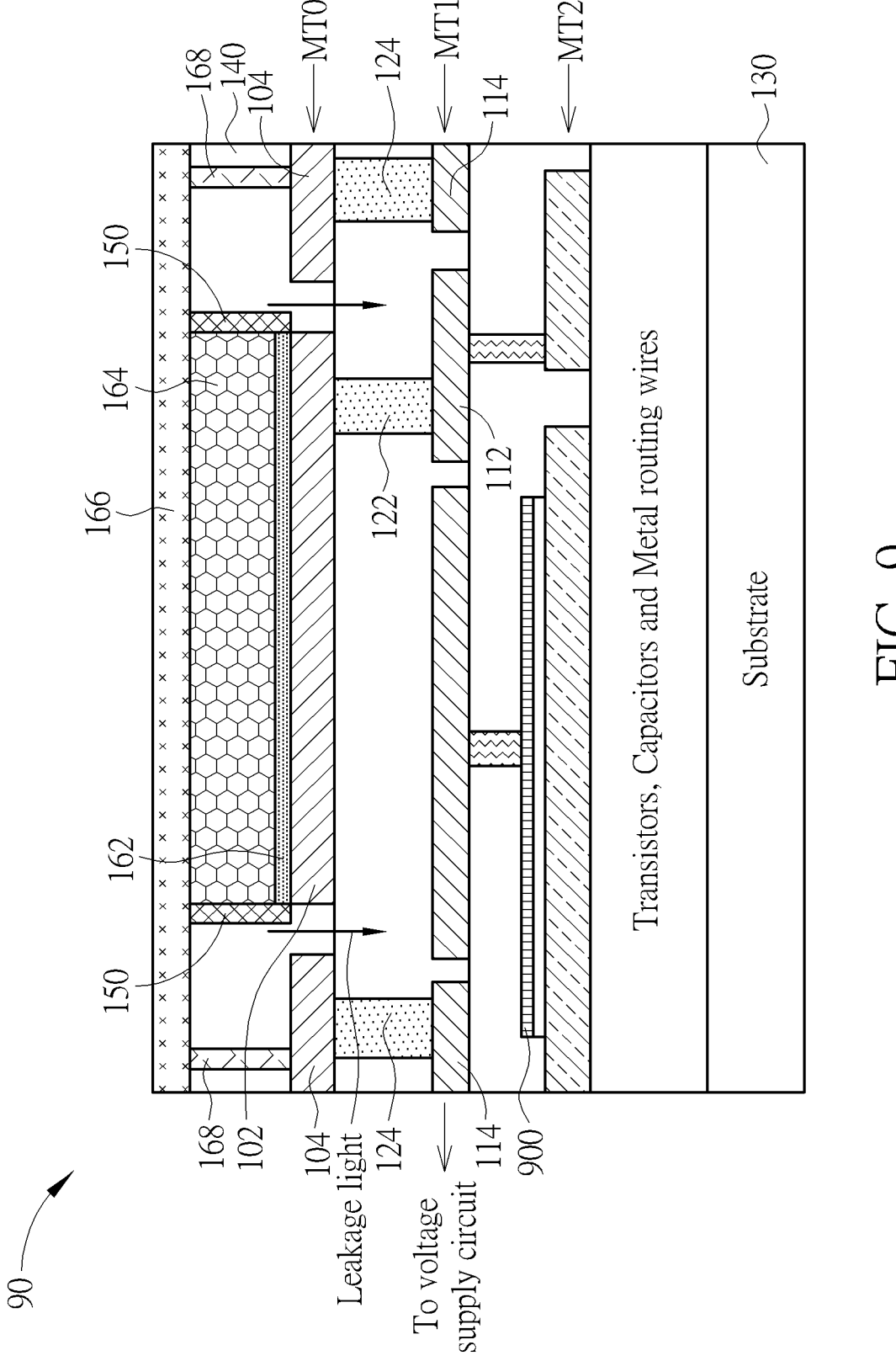
FIG. 9 illustrates a cross-sectional view of a pixel in which a MIM capacitor is deployed to block the leakage light.

FIG. 9 illustrates a cross-sectional view of a pixel 90 in which a MIM capacitor is deployed to block the leakage light. The pixel structure shown in FIG. 9 is similar to that shown in FIG. 3, and thus similar components are denoted by the same symbols. In the pixel 90, a MIM capacitor 900 is deployed in several metallization layers, including the metallization layers MT1 and MT2.

In addition, in the pixels 80 and 90, the outer electrode plate 114 of the second metallization layer MT1 may be coupled to a voltage supply circuit through an external routing metal, so as to improve the voltage/current transmission capability for the cathode, as similar to the implementation shown in FIG. 7.

To sum up, the present invention provides a novel architecture of pixels of a display panel, where one or more upper metallization layers are well designed to block the downward leakage light toward the bottom layers, in order to reduce or avoid leakage currents generated by the transistors when irradiated by the leakage light. In an embodiment, the length of the loop space in the second metallization layer may be different from the length of the loop space in the top metallization layer, where these two loop spaces do not overlap, so as to avoid a direct light path toward the bottom layers and thereby reduce the leakage light. In an embodiment, the MIM capacitor and/or the MOM capacitor of the pixels may be deployed in upper metallization layers, to increase the metal density in these metallization layers, thereby reducing the leakage light reaching the transistors in the bottom layers. In addition, with the well design of the upper metallization layers in the CMOS process, the metallization layer of the OLED process may be simplified, thereby improving the efficiency of light emission.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display panel comprising a plurality of pixels, a first pixel among the plurality of pixels comprising:
 a light emitting device, having a first electrode and a second electrode;
 a first metallization layer, comprising:
  an inner electrode plate, coupled to the first electrode of the light emitting device; and
  an outer electrode plate, coupled to the second electrode of the light emitting device, and separated from the inner electrode plate of the first metallization layer by a first loop space, wherein the first loop space surrounds the inner electrode plate of the first metallization layer; and
 a second metallization layer below the first metallization layer, comprising:
  an inner electrode plate, coupled to the inner electrode plate of the first metallization layer; and an outer electrode plate, separated from the inner electrode plate of the second metallization layer by a second loop space, wherein the second loop space surrounds the inner electrode plate of the second metallization layer;
 wherein a length of the second loop space is different from a length of the first loop space, and the second loop space and the first loop space do not overlap.

2. The display panel of claim 1, wherein the length of the second loop space is shorter than the length of the first loop space.

3. The display panel of claim 1, wherein the first electrode is an anode of the light emitting device, and the second electrode is a cathode of the light emitting device.

4. The display panel of claim 1, wherein each of the first loop space and the second loop space is a square loop space corresponding to an area of the first pixel.

5. The display panel of claim 1, wherein the outer electrode plate of the second metallization layer is coupled to the outer electrode plate of the first metallization layer.

6. The display panel of claim 1, wherein the outer electrode plate of the second metallization layer forms an electrode of a metal-insulator-metal (MIM) capacitor.

7. The display panel of claim 1, further comprising:
 a third metallization layer below the second metallization layer, comprising:
  at least two metal wires forming a metal-oxide-metal (MOM) capacitor.

8. The display panel of claim 7, wherein the third metallization layer further comprises a specific electrode plate coupled to the inner electrode plate of the second metallization layer, wherein a diameter, a side length, or an area of the specific electrode plate is different from a diameter, a side length, or an area of the inner electrode plate of the second metallization layer.

9. The display panel of claim 1, wherein the outer electrode plate of the first metallization layer is coupled to a voltage supply circuit through a routing metal outside the plurality of pixels.

10. The display panel of claim 1, further comprising:
 a silicon substrate to carry the plurality of pixels of the display panel.

* * * * *